United States Patent [19]

Lau

[11] Patent Number: 5,566,240
[45] Date of Patent: Oct. 15, 1996

[54] METHOD AND APPARATUS FOR ENHANCING THE QUALITY OF SOUND FROM ELECTRICALLY POWERED AUDIO EQUIPMENT

[76] Inventor: Ping-Cheung Lau, 9th Floor, Lea Hin Ind. Bldg., 41–43 Wong Chuk Hang Rd., Hong Kong, Hong Kong

[21] Appl. No.: 490,333

[22] Filed: Jun. 14, 1995

Related U.S. Application Data

[63] Continuation of Ser. No. 295,471, Aug. 24, 1994, abandoned.

[30] Foreign Application Priority Data

May 30, 1991 [GB] United Kingdom ............... 9111619

[51] Int. Cl.$^6$ .................................................. H03F 1/26
[52] U.S. Cl. .................................. 381/124; 381/77
[58] Field of Search ............................ 381/77, 97, 124; 324/73.1

[56] References Cited

U.S. PATENT DOCUMENTS

| | | | |
|---|---|---|---|
| 4,560,909 | 12/1985 | Peil | 315/219 |
| 4,686,380 | 8/1987 | Angott | 307/125 |
| 4,718,100 | 1/1988 | Brisson | 381/77 |
| 4,896,372 | 1/1990 | Weaver | 455/108 |
| 4,964,738 | 10/1990 | Lindsay et al. | 381/77 |

*Primary Examiner*—Curtis Kuntz
*Assistant Examiner*—Ping W. Lee
*Attorney, Agent, or Firm*—Samuels, Gauthier, Stevens & Reppert

[57] ABSTRACT

A silent method of, and apparatus for use in, enhancing the quality of sound from an electrically powered audio equipment assembly. The apparatus includes an electrical signal conducting component which forms a part of a home audio equipment assembly. The method includes the step of applying a pulsed digital signal having a wide and continuous range of frequencies within the audio frequency bandwidth to the electrical signal conducting component. The signal is applied at a signal level which is a substantial fraction of the maximum signal level rating of the component for a prolonged period of time.

7 Claims, 13 Drawing Sheets

SIGNAL FLOW DIRECTION

SIGNAL FLOW DIRECTION

METHOD AND APPARATUS FOR ENHANCING THE QUALITY OF SOUND FROM ELECTRICALLY POWERED AUDIO EQUIPMENT

This is a continuation of application Ser. No. 08/295,471 filed Aug. 24, 1994, now abandoned.

FIELD OF THE INVENTION

The present invention relates to electrically powered audio equipment.

It is generally recognized by audiophiles, producers of magazines relating to high quality audio equipment and manufacturers of high quality audio equipment that the quality of sound produced by electrically powered audio equipment improves with use of the equipment. During the first few weeks or months of use the sound quality gradually improves until it eventually reaches its best quality. This break-in period is as necessary for audio equipment as it is for a new car engine.

But unlike the break-in of a new car engine, it is not precisely known why the gradual improvement takes place with audio equipment. The most prevalent theory is that over a period of time the transmission of electrical audio signals through the wires and cables as well as the electronic parts and components in the circuits of the system removes from the conductors and the components defects that exist due to the manufacturing process. In the case of electrical signal conductors (interconnect and speaker cables) it is believed that the transmission of electrical audio signals removes or relaxes mechanical stresses both in the soft, pliable metals and in the dielectric jackets arising from the extrusion process by which the conductors are manufactured. The small amount of heat generated by the transmission of electrical audio signals is believed to release gasses and pollutants trapped near the surface of the conductor during the cooling and oxidation of the surface of the metal. It is also believed that under the influence of the electrical signal over a period of time the molecules in the dielectrics re-align themselves such that they can be polarised more simultaneously and homogeneously to the change of the electrical signal, thus reducing the interference to the signal in the dielectric material.

It is obviously desirable from the perspective of the end user of the audio equipment that this improvement be achieved as soon as possible. Currently the only known method of achieving this improvement or "burn-in" is to use the audio equipment as often and as loudly as possible. This approach is clearly undesirable because of the length of time required, not to mention the noise pollution, waste of electricity, and wear on the audio system, especially in the case of audio equipment which employs vacuum tubes. However, this method is the only method known to date and is often recommended in owner's manuals provided by the manufacturer with the equipment.

The results achieved by burning in the equipment by music playback are largely unpredictable and often unsatisfactory because the improvement achieved by this method varies considerably across the band of audio frequencies that make up the music played and the sound volume at which the equipment is being played.

SUMMARY OF THE INVENTION

The object of the present invention is to provide a faster, more reliable, superior method of enhancing the quality of sound emitted from electrically powered audio equipment, consequently avoiding use of the audio equipment for a long period of time at high volume to achieve burn-in. The superior method provided by the invention will not only burn-in faster and more consistently, but will achieve a significantly more effective burn-in that will, by means of a unique audio signal consisting of suitable frequencies and a specific burn-in current, enable the signal conducting cable or the equipment to produce a cleaner, more focussed and more coherent sound than was previously possible with the same cable or the same equipment.

The invention provides a method of enhancing the quality of sound from electrically powered audio equipment comprising applying to electrical signal conducting components which conduct signals within the audio frequency bandwith a signal having a relatively wide and continuous range of frequencies within the audio frequency bandwith at a signal level which is a substantial fraction of the maximum signal level rating of the component for a prolonged period of time.

With a suitable choice of signal current and frequencies the burn-in and resultant sound enhancement can be achieved in a short period of time, typically over two to three days, without noise pollution, using a relatively small amount of electricity, and without wear on the audio system itself.

The invention also provides an apparatus for use in connection with the method of the invention, the apparatus comprising circuitry for producing a low impedance signal with a self repetitive wide frequency band, and including terminals for facilitating connection of electrical signal conducting components.

A particularly preferred construction of apparatus for use in enhancing electrical signal conducting cables comprises a current sourcing amplifier with an output impedance in the eight ohm range, a signal generator which generates square waves of variable width in a repeating cycle, and terminals which are suitable to optionally transmit the signal along both the live and neutral wire of a cable, which is to be connected in between low impedance sources such as a power amplifier and a loudspeaker (examples of this type of cable are loudspeaker cable and balanced (XLR) cable) or to transmit the signal along the live wire only in a cable which is to be connected in between high impedance sources such as a pre-amplifier and power amplifier (an example of this type of cable is coaxial cable).

The apparatus in accordance with the particularly preferred construction can be used to enhance most commercially available cables commonly used in audio systems, including both relatively lower powered interconnection cables, and relatively higher powered loudspeaker cables.

BRIEF DESCRIPTION OF THE DRAWINGS

One construction of apparatus in accordance with the invention will now be described more particularly with reference to the accompanying drawings. In the drawings.

DETAILED DESCRIPTION OF PREFERRED EMBODIMENT

Figure 1:
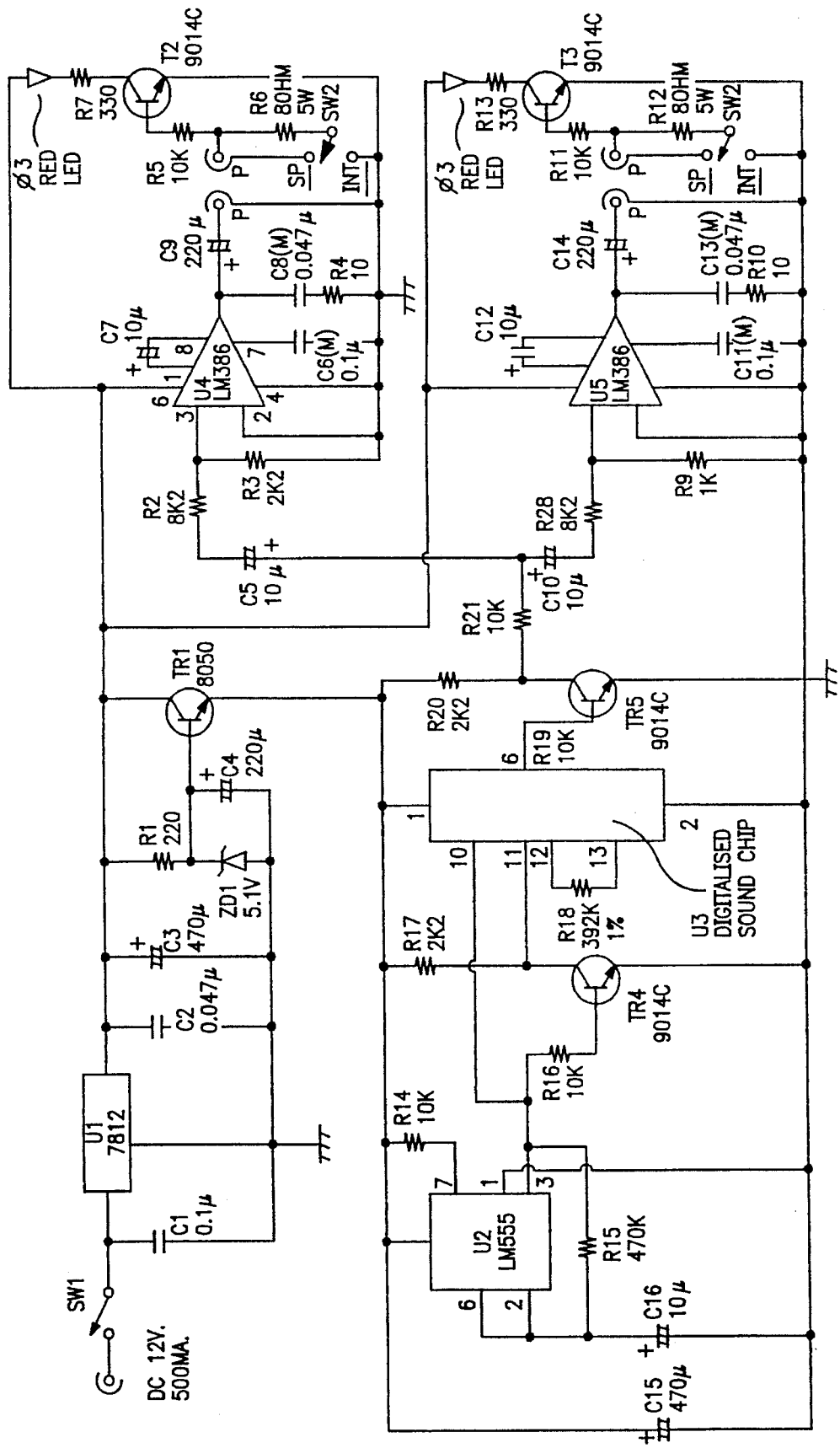
FIG. 1 is a circuit diagram of the apparatus.
Figure 2A:
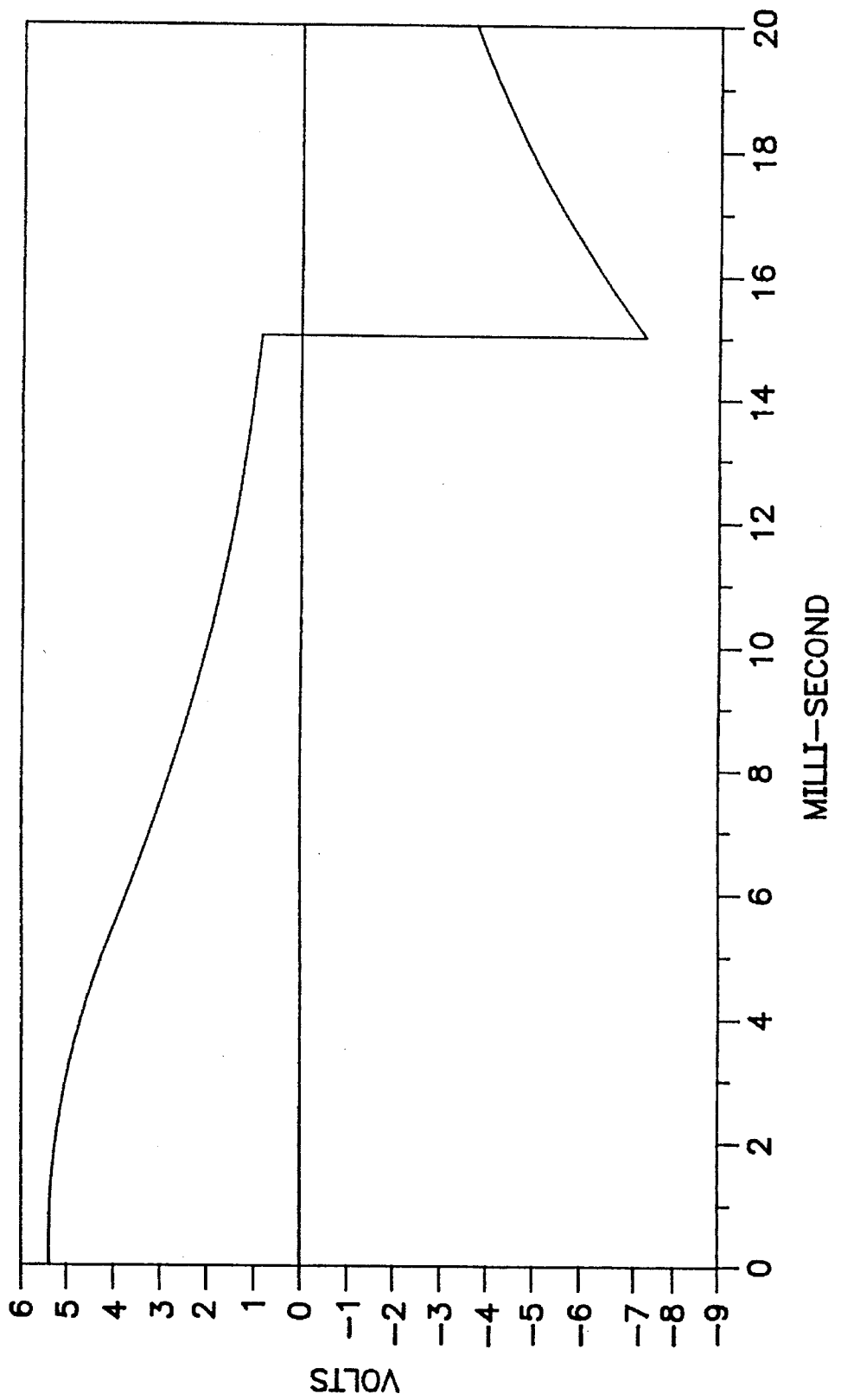
FIGS. 2A to 2G are profiles of the waveform of the signal emitted by the signal generator plotted against time, taken at a sampling interval of about one second, showing the change in the pulse width of the signal in one cycle.
Figure 2B:
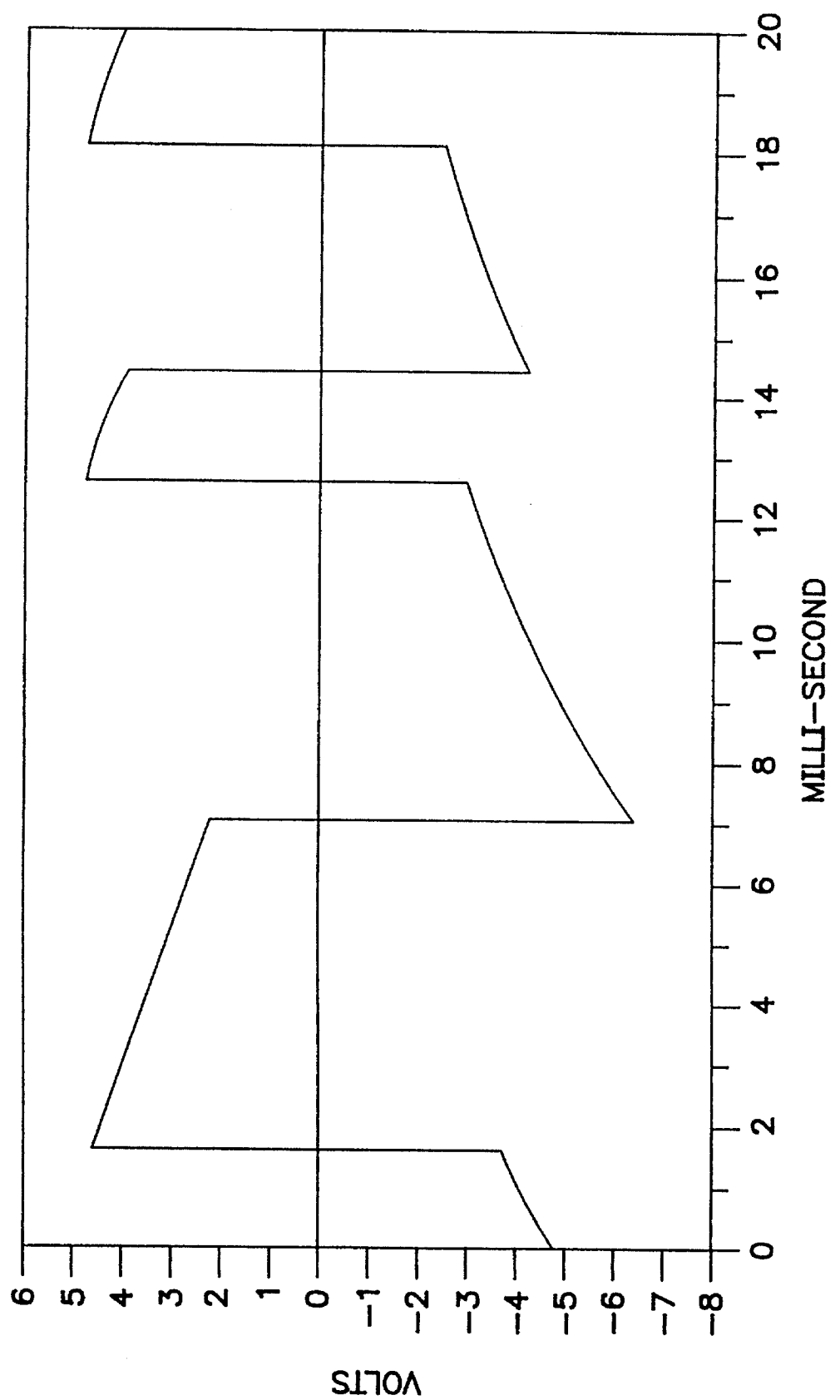
Figure 2C:
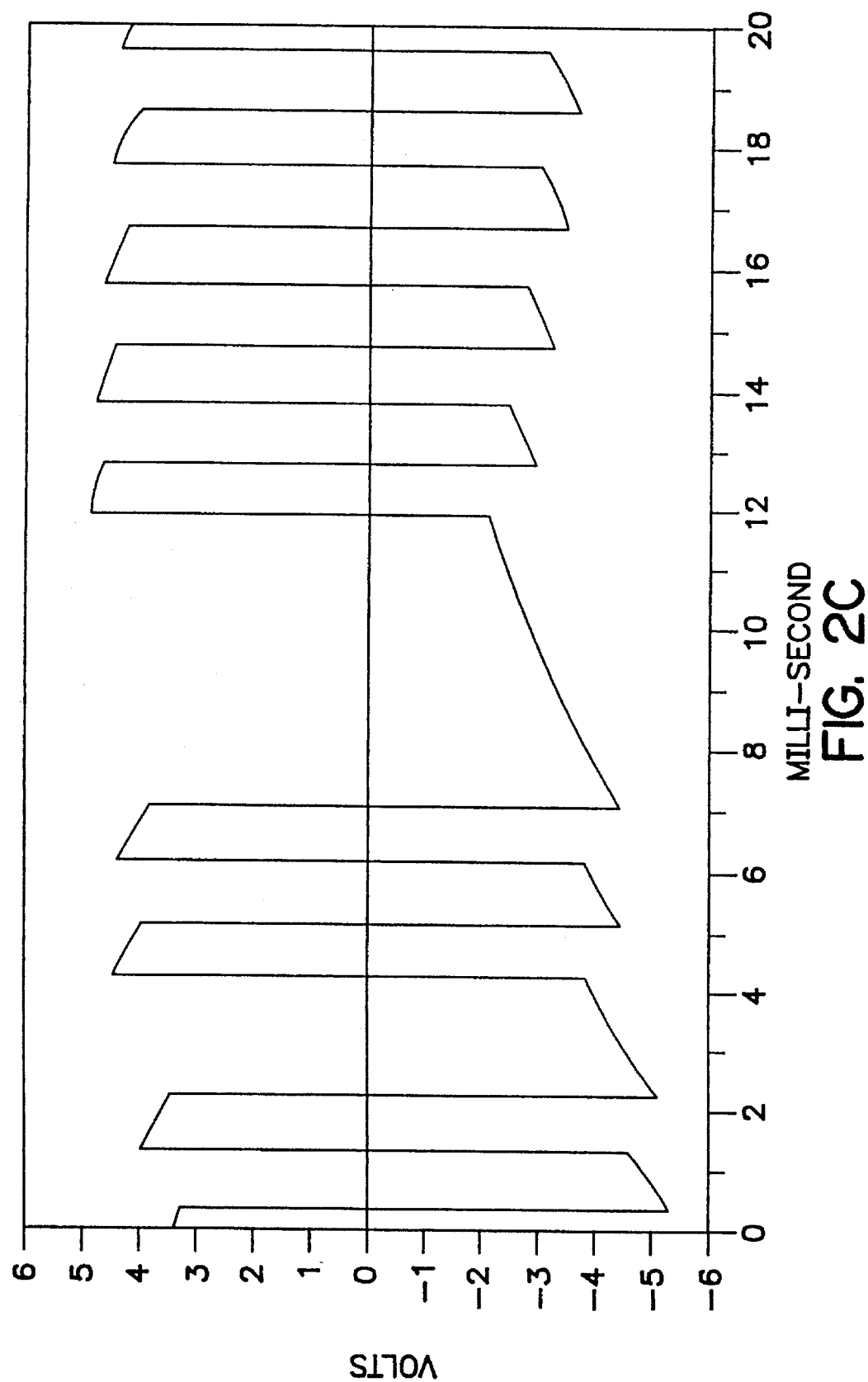
Figure 2D:
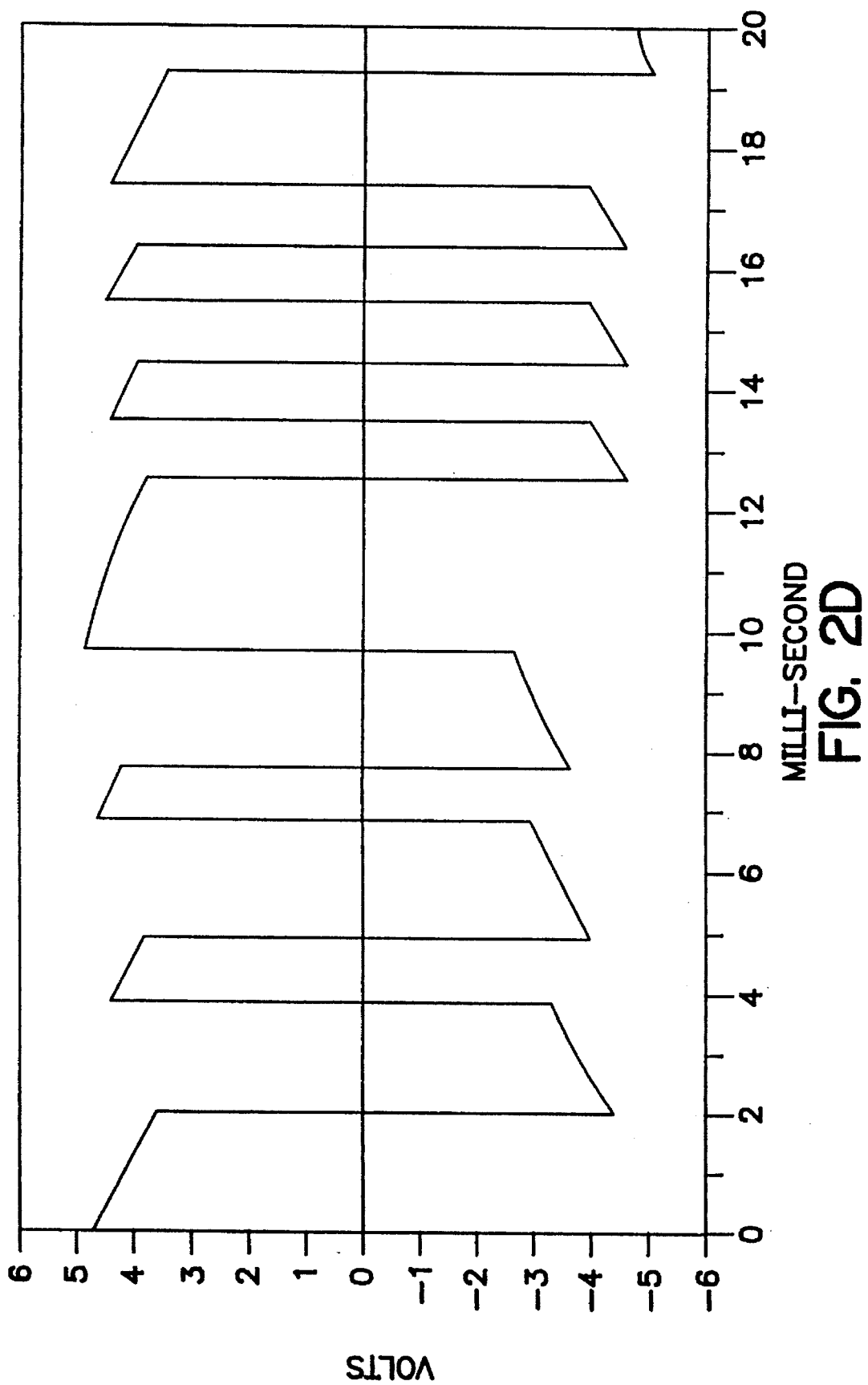
Figure 2E:
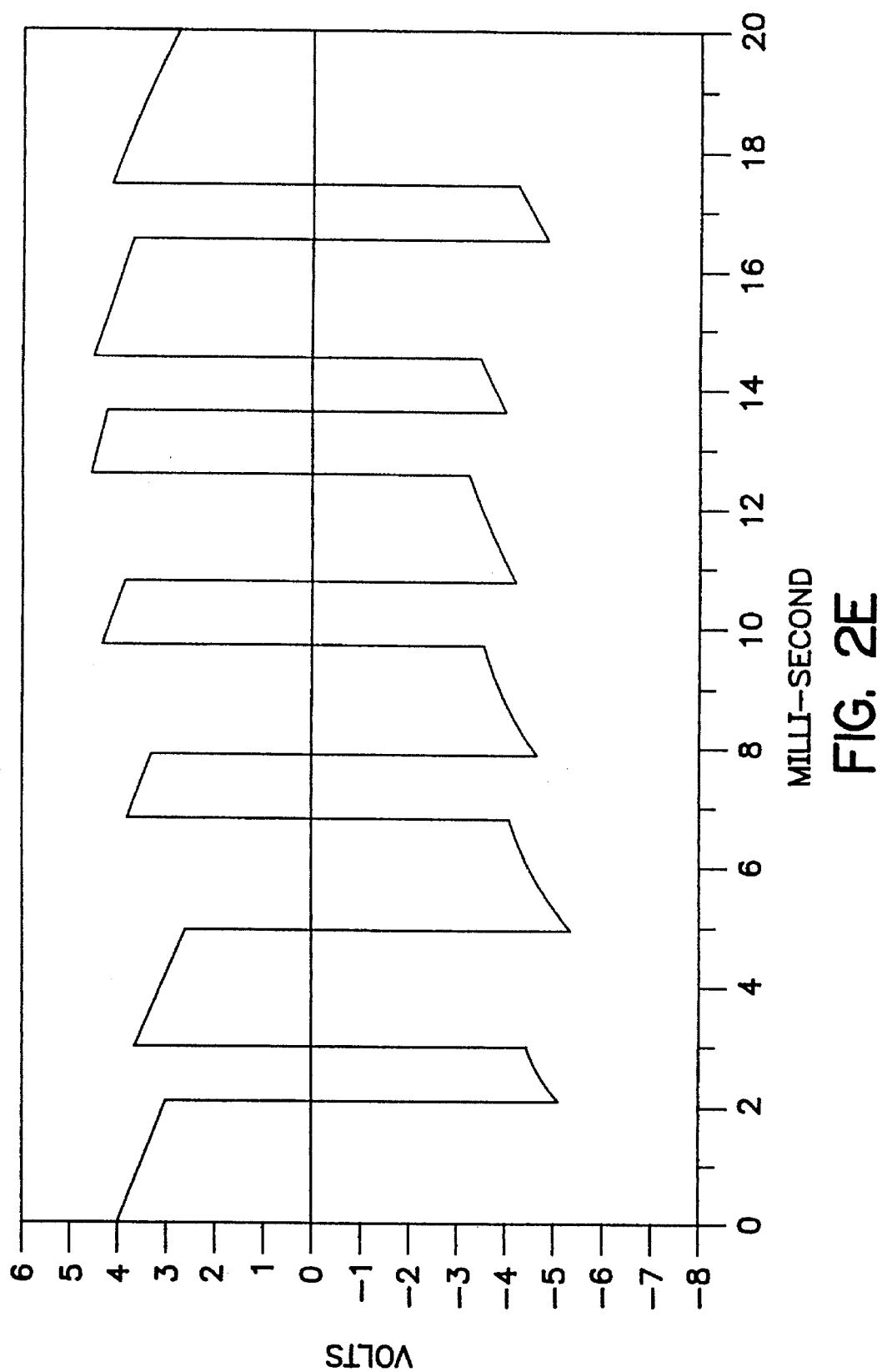
Figure 2F:
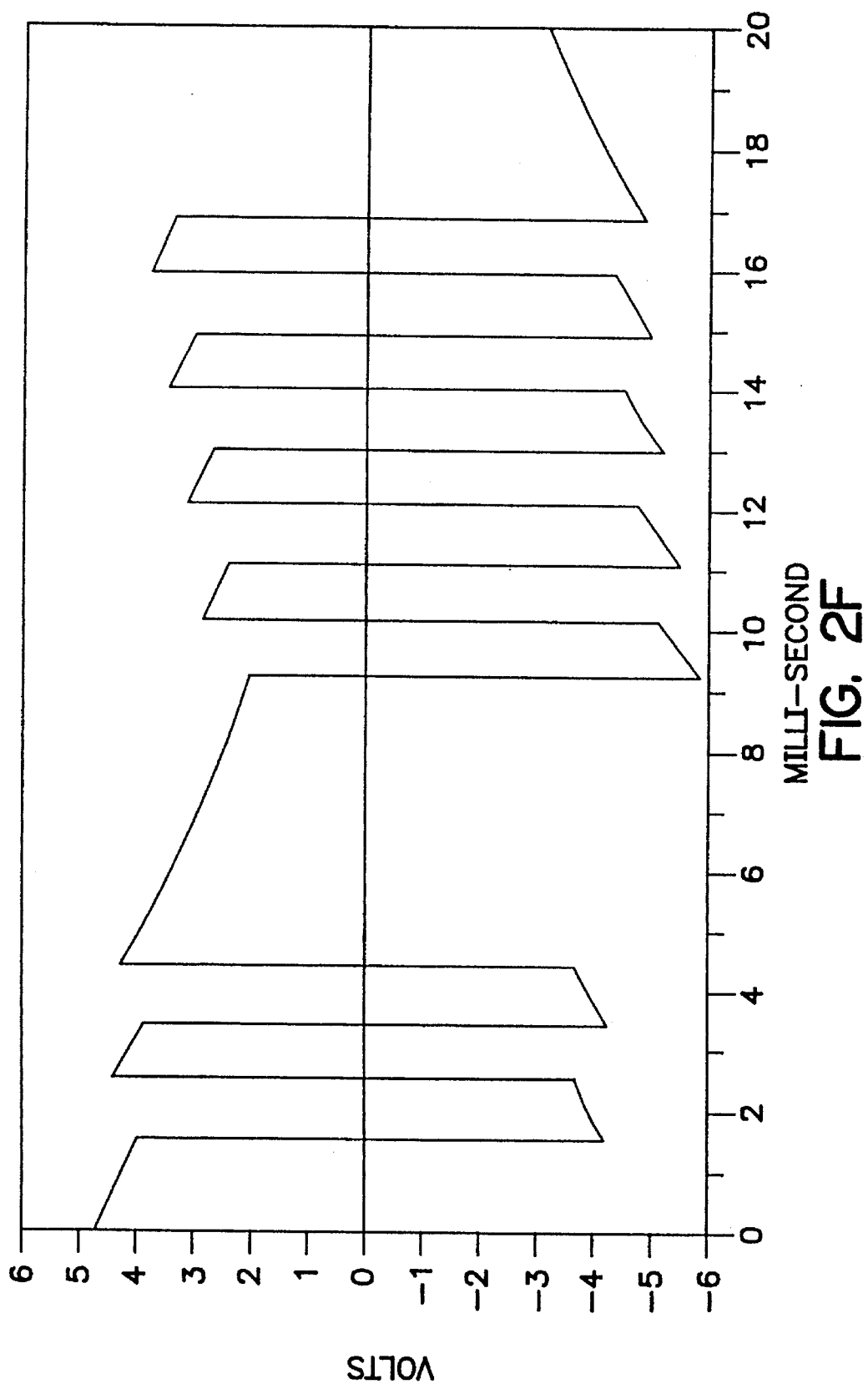
Figure 2G:
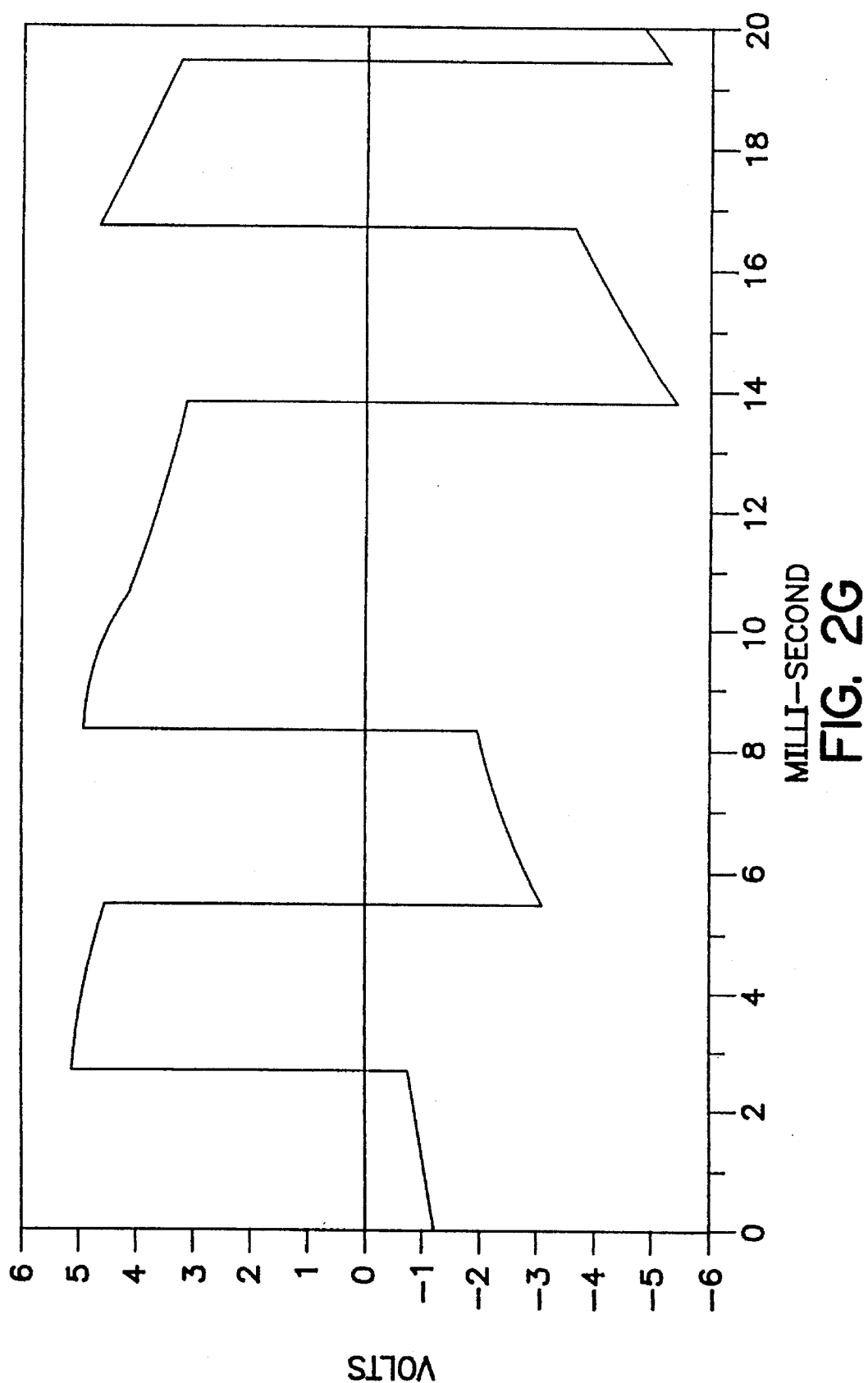

Referring now to FIG. 1, the principal components are listed below:

SW1 An on/off switch for the 12 volt 500 mA supply.

U1 and TR1 Integrated circuit and transistor for filtering and regulating the 12 volt 500 mA supply.

U2 Integrated timer circuit to control the duty cycle (repetition rate) of the signal generator.

U3 Integrated circuit for generating the signal.

U4 Amplifier associated with an eight ohm resistor giving an output current of approximately 0.5A.

U5 Parallel circuit to U4, so that two cables may be enhanced simultaneously.

P Terminals to which cables may be connected.

SW2 Double pole double throw selector switch used to select different circuit options for interconnection cables and loudspeaker cables.

The function of switch SW2 will now be described in more detail. When it is desired to enhance the quality of an interconnection cable, which is typically a relatively low powered coaxial cable, through which the signal flows in a parallel circuit configuration, then the switch SW2 is set to position INT causing the signal output from the apparatus according to the invention, to be transmitted along the live wire only of the coaxial cable. When it is desired to enhance the quality of a loudspeaker cable, typically a higher powered non-coaxial cable through which sound signals are transmitted in both directions, then the switch SW2 is thrown to the SP position so that the signal emitted by the apparatus according to the invention, is transmitted along the live wire of the loudspeaker cable and then back along the neutral wire, that is to say the live and neutral wires are connected in series with one another.

The different current paths for coaxial and non-coaxial cables were determined after a series of tests to optimise the effectiveness of burn in without causing any side effects to the sound signal conducted by a cable. The tests showed that burning in of a coaxial cable using the current path for the non-coaxial cable (SP setting) could result in non-reversable sound degradation to the coaxial cable. Burning in a non-coaxial cable in the coaxial mode (INT setting) could add coloration to the sound of the non-coaxial cable. For the burn in of other audio components such as amplifiers and loudspeakers, the current path restriction does not apply.

Turning now to FIGS. 2A to 2G, there is illustrated the signal profile taken in the time domain at a sampling interval of about one second between each Figure. This signal profile has been proven to produce especially good results. The signal comprises square waves of greatly varying width, and a pattern of the square wave is emitted over a period of seven seconds, the pattern being generated by integrated circuit U3 and governed by integrated circuit U2 which causes the signal generator to repeat the pattern at the end of seven seconds.

Figure 3:
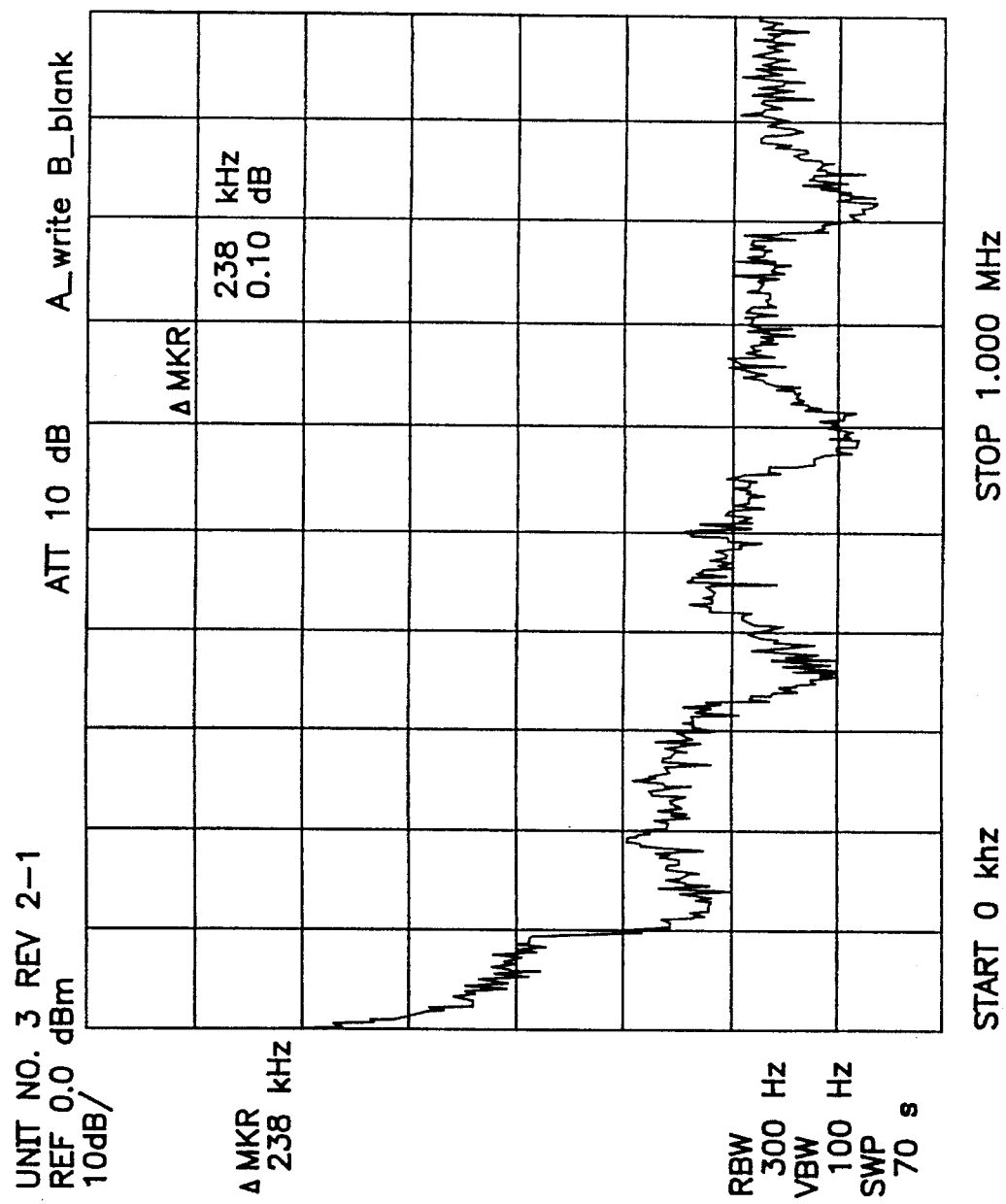
FIG. 3 is a graph showing the amplitude of signals actually applied to a cable plotted against frequency.

Referring now to FIG. 3, the Figure shows the spectrum of frequencies actually applied to the cable being enhanced, this frequency spectrum arising from the signal shown in FIGS. 2A to 2G as modified by amplifiers U4 and U5, which are simply conventional commercially available amplifiers.

Turning now to the impedance which governs the signal current, it will be seen that both amplifiers U4 and U5 have an eight ohm impedance load. This level of impedance is to limit the burn-in current to about 0.5 AMPS RMS. The burn-in current at any instant varies in accordance with the duty cycle and frequency of the signal pulse train. At very low frequencies, the burn-in current is about 0.35 AMP RMS and at the higher frequencies, the burn-in current is limited to about 0.5 AMP RMS. This level of burn-in current has been found to produce optimum and consistent results in both lower powered cables such as interconnection cables, and in higher powered cables such as loudspeaker cables. The impedance load may be varied to obtain a desired burn-in voltage and current that matches the electrical rating of the equipment assembly without overloading it. In the case of commercially available interconnection cables, which are designed to take a maximum of two to three AMPS, it has been found that currents substantially less then 0.5 AMPS RMS are insufficient to produce the desired enhancement. However, currents substantially greater than 0.5 AMPS RMS, for example currents approaching the maximum rating of the cable, also do not produce the desired enhancement, probably because they cause overheating of the conductor thereby introducing as many defects, such as thermal stresses, as they eliminate.

USER INSTRUCTIONS

Figure 4A:
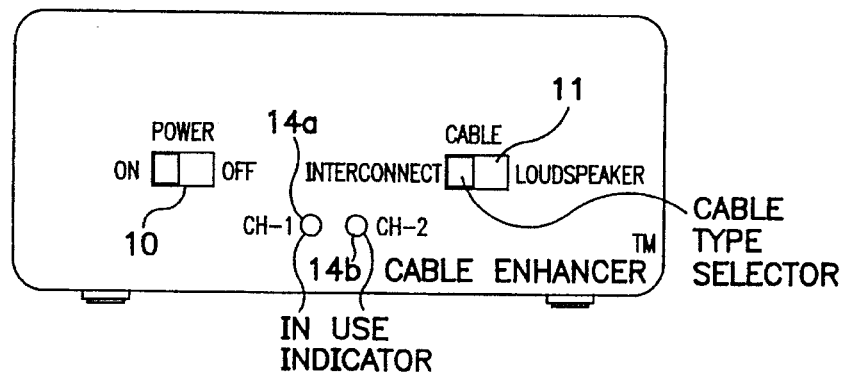
FIGS. 4A, 4B and 4C are front, top and rear views of apparatus in accordance with the invention.
Figure 4B:
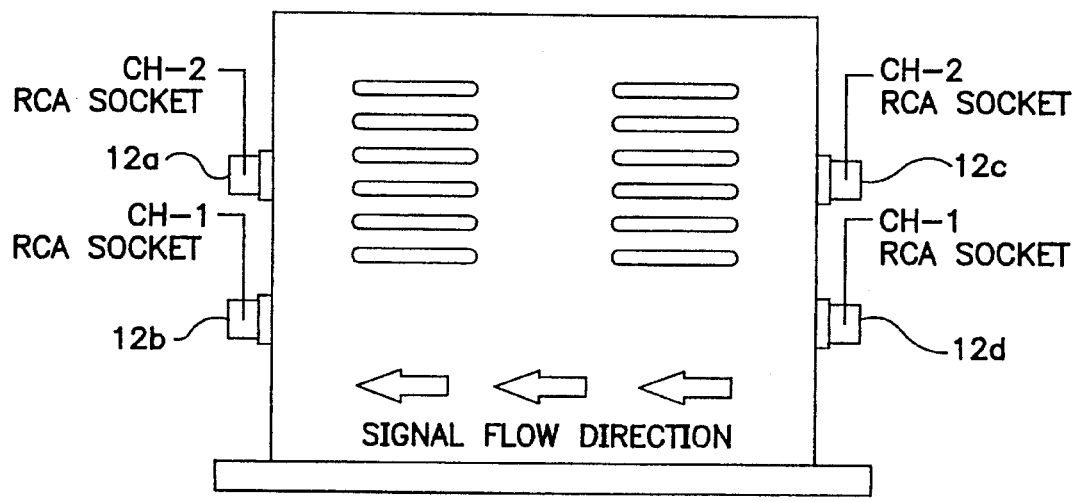
Figure 4C:
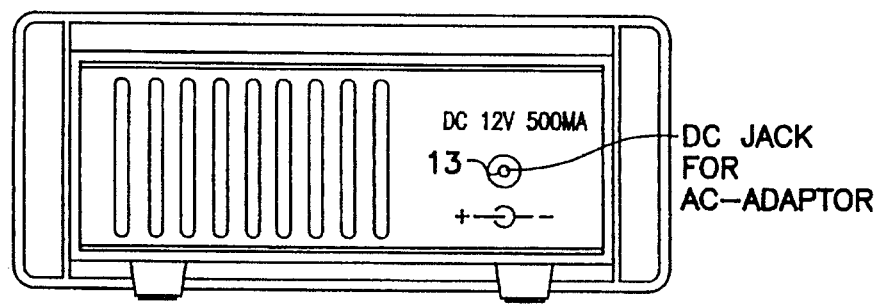

The use of the apparatus by an end-user will now be described in terms of user instructions which consist of FIGS. 4A, 4B and 4C which illustrate generally the external features of the apparatus referred to as the "Cable Enhancer", followed by four Tables of detailed instructions and accompanying drawings FIGS. 5, 6, 7A and 7B, 8A and 8B as set out below.

INTERCONNECT CABLE BURN-IN PROCEDURE—FIG. 5

(1) Be sure the power switch 10 on the front of the Cable Enhancer is in the off position while making cable connections. This will avoid accidental short circuiting of the Cable Enhancer while connections are being made. Short circuiting could cause permanent damage to the Cable Enhancer.

(2) Set the cable selector switch 11 to the "interconnect" position.

Figure 5:
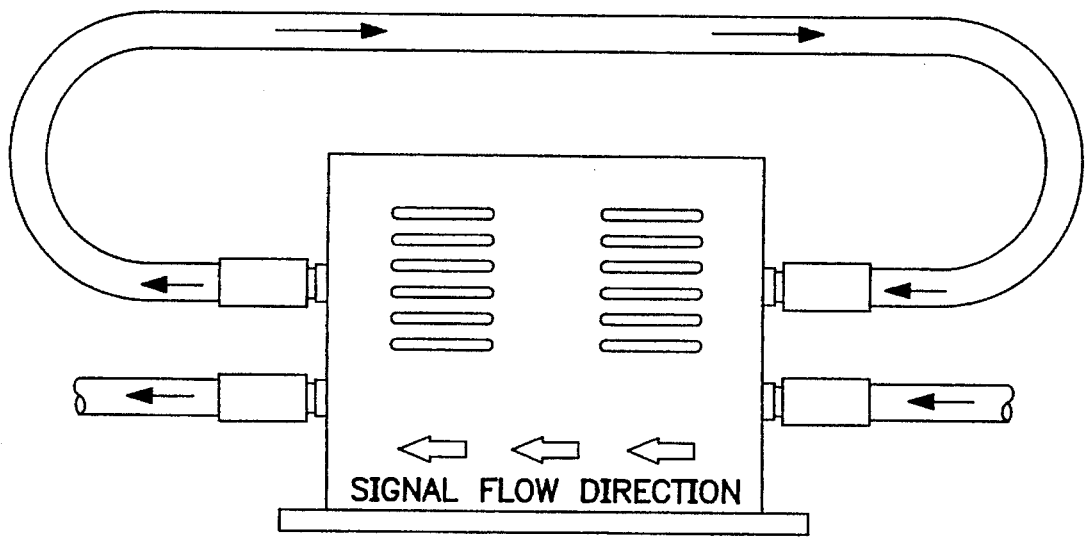
FIGS. 5, 6, 7A and 7B and 8A and 8B show the use of the apparatus of FIGS. 4A, 4B and 4C.

(3) Interconnect cables are directional. Align your cables with the arrow on the top of the Cable Enhancer as shown in FIG. 5 and connect the cables as shown to the terminals 12a, 12b, 12c, 12d. If there are no direction indicators on your cables, label the cables with the arrow stickers provided. These arrows will now permanently indicate the direction of your cables.

(4) An alternating current (AC) adaptor (not shown) is provided with your Cable Enhancer. Plug the direct current (DC) Output Jack of the AC adaptor into the back of your Cable Enhancer at jack 13. Then plug the AC adaptor into an AC outlet.

(5) Turn the Power Switch 10 to the ON position. If all connections are correct the two light emitting diode (LED) indicators 14a, 14b will illuminate and blink slightly.

(6) Allow a minimum of 48 hours of continuous and uninterrupted burn-in of your interconnect cables. When used properly the Cable Enhancer cannot damage your cables. Quality cables may require longer than 48 hours for best burn-in. Burn-in your cables for as long as you like or until no further improvement in your system can be heard.

(7) If you wish to verify the improvement achieved by burning in your cables with the Cable Enhancer, temporarily switch back to a pair of equivalent cables that have not been burned-in on the Cable Enhancer and compare.

(8) Do not attempt to burn-in your interconnect cables using the speaker cable mode; the result has been found to be unpredictable and in some cases, it could result in non-reversable sound degradation of your cables.

75 OHM COAXIAL CABLES BURN IN PROCEDURE—FIG. 6

(1) 75 ohm coaxial cables are widely used for the digital signal transmission between compact disc (CD) transports and digital to analogue (D-A) converters. The digital format allows the musical signals of the left and right channels to be composited into a single channel. Therefore it only requires one 75 ohm coaxial cable for the signal transmission between a CD transport and a D-A converter.

(2) Be sure the power switch 10 on the front of the Cable Enhancer is in the OFF position while making cable connections. This will,avoid accidental short circuiting of the Cable Enhancer while connections are being made. Short circuiting could cause permanent damage to your Cable Enhancer.

(3) Set the cable selector 11 switch to the "INTERCONNECT" position.

Figure 6:
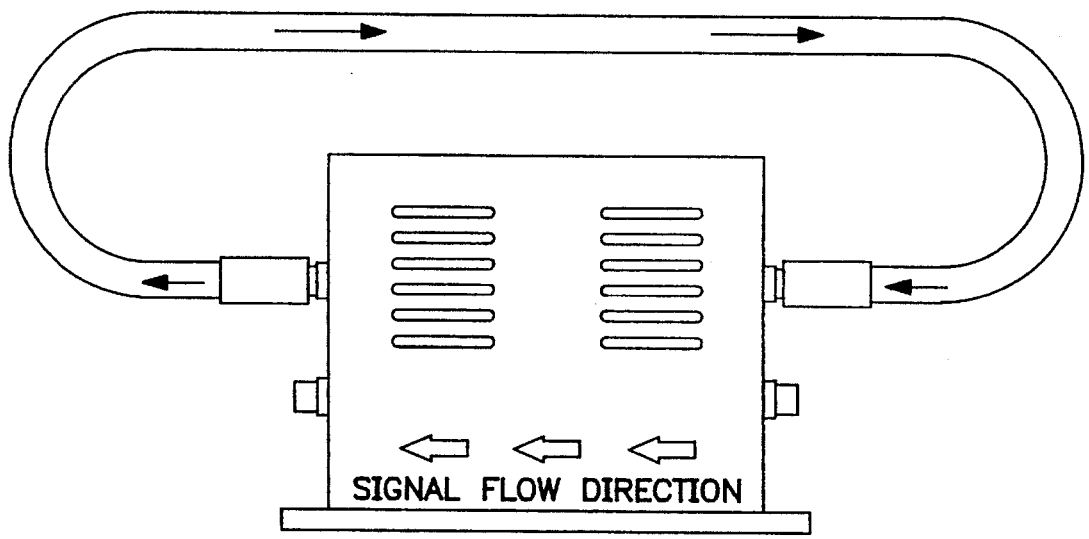

(4) Audio cables are directional. Align your 75 ohm coaxial cable with the arrow on the top of the Cable Enhancer and connect your cable to the red color coded RCA terminals 12a, 12c as shown in FIG. 6. If there is no direction indicator on your cable, label the cable with the arrow stickers provided. This arrow will now permanently indicate the direction of your cable.

(5) Follow steps (4) through (7) of the interconnect cable burn-in procedure described with reference to FIG. 5.

(6) Do not attempt to burn in your 75 ohm coaxial cable using the speaker cable procedure described hereinafter with reference to FIGS. 7A and 7B. The results are unpredictable.

Figure 7A:
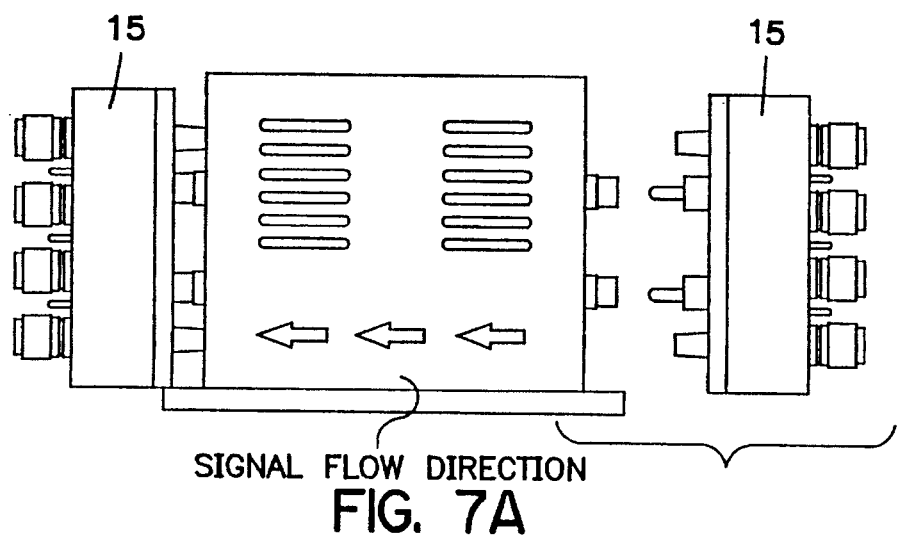
Figure 7B:
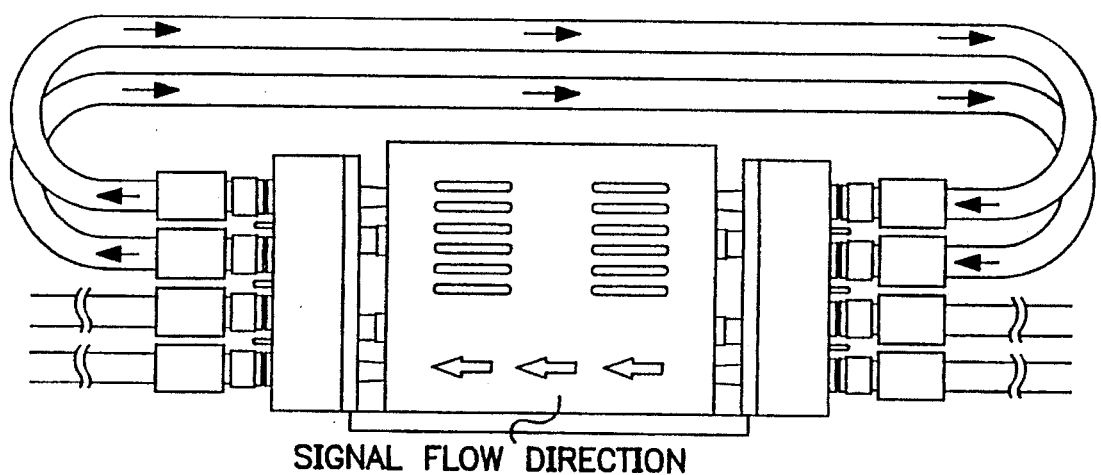

SPEAKER CABLE BURN-IN PROCEDURE—FIGS. 7A/7B (1) Be sure the power switch on the front of the Cable Enhancer is in the off position while making cable connections. This will avoid accidental short circuiting of the Cable Enhancer while connections are being made. Short circuiting could cause permanent damage to your Cable Enhancer.

(2) Set the Cable Selector switch 11 to the "speaker" position.

(3) Align and plug-in the loudspeaker cable adaptors 15 provided with your Cable Enhancer as shown in FIG. 7A.

(4) Speaker cables are directional. Align your cables with the arrows on the top of the Cable Enhancer as shown in FIG. 7B and connect the cables to the speaker cable adaptor. If there are no direction indicators on your cables, label the cables with the stickers provided. These arrows will now permanently indicate the direction of your cables.

Note: Loudspeaker cables usually consist of two pairs of conductors color coded red and black for connection identification. Follow this color code when connecting the cables to the color coded posts of the speaker cable adaptor as in FIG. 7B.

Be careful to not cross circuit when making these connections (5) Follow steps (4) through (7) of the interconnect cable burn in procedure described with reference to FIG. 5.

ALTERNATE METHOD AND PROCEDURES FOR SPEAKER CABLE BURN-IN—FIGS. 8A/8B

The following alternate speaker cable burn-in method using the interconnect mode will generate a higher current density in the cables. The sonic result is an enrichment in the mid band of your speaker cable and the overall sound will become "warmer". However for best sonic transparency and the most natural tonal balance in sound, please follow the speaker cable burn-in procedure using the speaker cable mode as described above with reference to FIGS. 7A and 7B. The choice is purely a matter of your personal taste.

(1) Be sure the power switch 10 on the front of the Cable Enhancer is in the off position while making cable connections. This will avoid accidental short circuiting of the unit while connections are being made. Short circuiting could cause permanent damage to your Cable Enhancer.

(2) Set the cable selector switch 11 to the "INTERCONNECT" position.

Figure 8A:
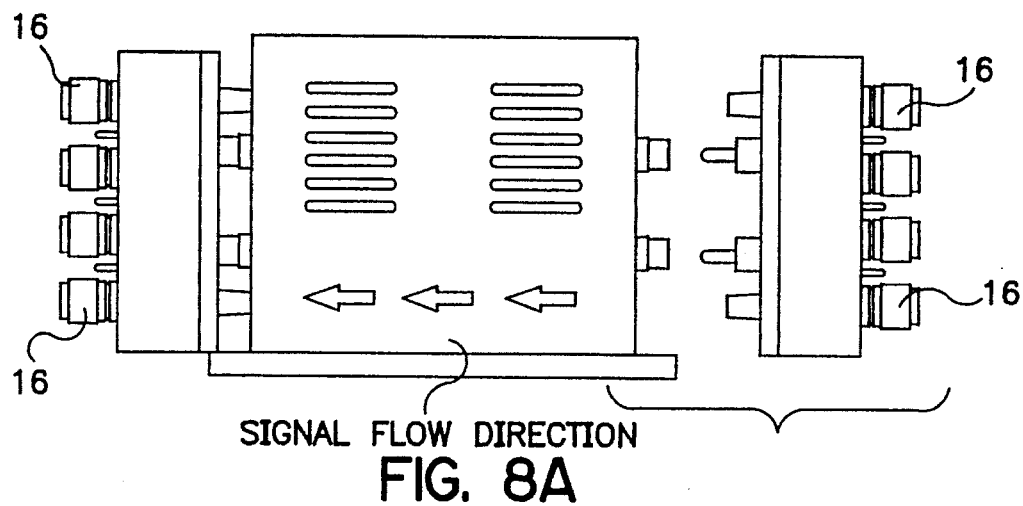

(3) Align and plug-in the loudspeaker cable adaptors 15 provided with your Cable Enhancer as shown in FIG. 8A.

Figure 8B:
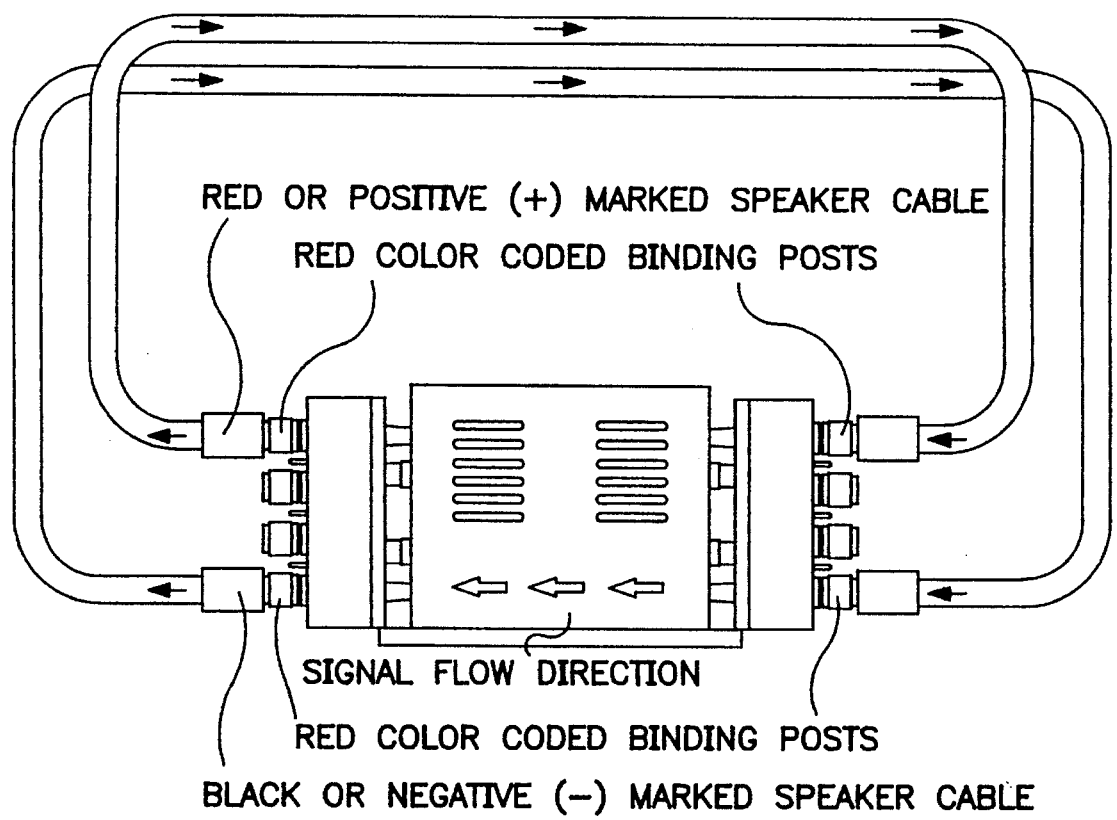

(4) Speaker cables are directional. Align your cables with the arrows on the top of the Cable Enhancer and connect the cables to the red color coded binding posts 16 of the speaker cable adaptor 15 as shown in FIG. 8B.

Note: Loudspeaker cables usually consist of two pairs of conductors color coded red and black for connection identification. When burning in your speaker cables using the "INTERCONNECT" mode, you can only burn in one pair of cables at a time. Each pair of speaker cables will take a minimum of 48 hours to burn in. Therefore it will take you a minimum of 96 hours to burn in two pairs of speaker cables. Be careful not to cross circuit when making these connections!

(5) Follow steps (4) through (7) of the interconnect cable burn in procedure described with reference to FIG. 5.

I claim:

1. Apparatus for silently enhancing the sound transmission characteristics of a cable assembly for use with a home audio equipment assembly within a desired period of time, said apparatus comprising:

generating means for generating a digital pulsed current signal within the audio frequency bandwidth at a current rating of approximately 0.5 AMP RMS, said digital pulsed current signal continuously varying in frequency and in pulse width such that the ratio of positive signal time to negative signal time between consecutive pulses is continuously varying; and application means for applying said signal to said cable assembly for said desired period of time.

2. Apparatus as claimed in claim 1, wherein said apparatus further comprises: power supply connections for use in connecting the apparatus to an electrical supply; and terminals to which said cable assembly is connected so as to allow the signal to be applied thereto.

3. Apparatus as claimed in claim 2, wherein said apparatus further comprises: a switch in communication with first and second circuit paths for use in selecting from first and second modes of operation, said first mode for enhancing a coaxial cable in which said digital pulsed current signal is transmitted in one direction along the live wire only of the coaxial cable, and said second mode for enhancing a non coaxial cable in which said digital pulsed current signal is transmitted along the live wire and back along the neutral wire of the non coaxial cable.

4. Apparatus as claimed in claim 1, wherein said generating means is operative to generate a signal comprising square waves of variable width in a repeating cycle.

5. A method of silently enhancing the sound transmission characteristics of a cable for use with a home audio equipment assembly, comprising applying to the cable a digital pulsed current signal within the audio frequency bandwidth, at a current rating of approximately 0.5 AMP RMS for a period of at least forty eight hours, said digital pulsed current signal continuously varying in frequency and in pulse width such that the ratio of positive signal time to negative signal time between consecutive pulses is continuously varying whereby the sound transmission characteristics of the cable are silently enhanced.

6. A method as claimed in claim 5, wherein said method further comprises an initial step of adjusting said digital pulsed current signal by varying the value of a loading resistor to obtain a desired burn-in voltage and current matching the electrical rating of the equipment assembly without overloading it.

7. A method as claimed in claim 5, wherein the signal is a square wave signal of varying frequency.

* * * * *